US008843061B2

(12) United States Patent
Rofougaran et al.

(10) Patent No.: US 8,843,061 B2
(45) Date of Patent: *Sep. 23, 2014

(54) METHOD AND SYSTEM FOR POWER TRANSFER UTILIZING LEAKY WAVE ANTENNAS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 249 days.

This patent is subject to a terminal disclaimer.

(21) Appl. No.: 12/797,214

(22) Filed: Jun. 9, 2010

(65) Prior Publication Data

US 2010/0308668 A1 Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.

| | |
|---|---|
| *H04B 5/00* | (2006.01) |
| *H01Q 11/12* | (2006.01) |
| *G01S 13/06* | (2006.01) |
| *H01Q 1/22* | (2006.01) |
| *H01Q 13/22* | (2006.01) |
| *H01Q 13/20* | (2006.01) |
| *H04B 1/04* | (2006.01) |
| *H04B 7/24* | (2006.01) |
| *H01Q 15/00* | (2006.01) |

(52) U.S. Cl.
CPC .............. *G01S 13/06* (2013.01); *H01Q 15/006* (2013.01); *H01Q 1/2283* (2013.01); *H01Q 13/22* (2013.01); *H01Q 13/20* (2013.01); *H04B 1/04* (2013.01); *H04B 1/0458* (2013.01); *H04B 5/0031* (2013.01); *H04B 7/24* (2013.01)
USPC .......... 455/41.1; 455/41.2; 455/121; 455/125

(58) Field of Classification Search
CPC ..... H01Q 1/2283; H01Q 13/20; H01Q 13/26; H01Q 13/22; H01Q 15/006; H01Q 15/0066; H01Q 15/008; H04B 1/0458
USPC ............ 455/41.1, 41.2, 562.1, 121, 125, 272, 455/289
See application file for complete search history.

(56) References Cited

U.S. PATENT DOCUMENTS 3,972,049 A * 7/1976 Kaloi ............................ 343/829
4,078,237 A * 3/1978 Kaloi ..................... 343/700 MS
(Continued)

OTHER PUBLICATIONS

Iyer et al, "Wireless chip to chip interconnection for multichip modules using leaky wave antennas", Electronic Letter, vol. 29, No. 23, pp. 2030-2031, Nov. 1993.*
Huang et al, "An Electronically Switchable Leaky Wave Antenna", IEEE trans. on Antenna and Propagation, vol. 48, No. 11, Nov. 2000.*

(Continued)

*Primary Examiner* — Duc M Nguyen
(74) *Attorney, Agent, or Firm* — Oblon, Spivak, McClelland, Maier & Neustadt, L.L.P.

(57) ABSTRACT

Methods and systems for power transfer utilizing leaky wave antennas (LWAs) are disclosed and may include configuring one or more LWAs in a communication device to receive RF signals that are communicated from one or more other LWAs that are external to the communication device. The communication device may be powered utilizing the RF signals that are received via the configured LWAs. A resonant frequency of the LWAs may be configured utilizing micro-electro-mechanical systems (MEMS) deflection. The LWAs may be configured to receive the RF signals from a desired direction. The LWAs may comprise microstrip or coplanar waveguides, wherein a cavity height of the LWAs is dependent on spacing between conductive lines in the waveguides. The LWAs may be integrated in integrated circuits, integrated circuit packages, and/or printed circuit boards. The packages may be affixed to printed circuit boards and the integrated circuits may be flip-chip-bonded to the packages.

20 Claims, 10 Drawing Sheets

(56) References Cited

U.S. PATENT DOCUMENTS

| | | | |
|---|---|---|---|
| 4,701,763 A | 10/1987 | Yamamoto | |
| 5,138,436 A * | 8/1992 | Koepf | 257/728 |
| 5,300,875 A | 4/1994 | Tuttle | |
| 5,363,075 A * | 11/1994 | Fanucchi | 333/246 |
| 5,387,885 A | 2/1995 | Chi | |
| 5,416,492 A * | 5/1995 | Takahashi et al. | 343/771 |
| 5,717,943 A | 2/1998 | Barker | |
| 5,900,843 A | 5/1999 | Lee | |
| 5,912,598 A | 6/1999 | Stones | |
| 6,005,520 A * | 12/1999 | Nalbandian et al. | 343/700 MS |
| 6,037,743 A | 3/2000 | White | |
| 6,127,799 A | 10/2000 | Krishnan | |
| 6,212,431 B1 * | 4/2001 | Hahn et al. | 607/61 |
| 6,285,325 B1 | 9/2001 | Nalbandian | |
| 6,597,323 B2 | 7/2003 | Teshirogi | |
| 6,603,915 B2 * | 8/2003 | Glebov et al. | 385/129 |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,002,517 B2 | 2/2006 | Noujeim | |
| 7,020,701 B1 | 3/2006 | Gelvin | |
| 7,023,374 B2 | 4/2006 | Jossef | |
| 7,084,823 B2 | 8/2006 | Caimi | |
| 7,233,299 B2 * | 6/2007 | Thevenot et al. | 343/912 |
| 7,253,780 B2 | 8/2007 | Sievenpiper | |
| 7,268,517 B2 | 9/2007 | Rahmel | |
| 7,317,342 B2 | 1/2008 | Saint-Laurent | |
| 7,330,090 B2 | 2/2008 | Itoh | |
| 7,348,928 B2 * | 3/2008 | Ma et al. | 343/770 |
| 7,373,133 B2 | 5/2008 | Mickle | |
| 7,394,288 B1 | 7/2008 | Agarwal | |
| 7,535,958 B2 | 5/2009 | Best | |
| 7,557,714 B2 * | 7/2009 | Roeder et al. | 340/572.7 |
| 7,592,957 B2 | 9/2009 | Achour | |
| 7,620,424 B2 | 11/2009 | Cetiner | |
| 7,733,265 B2 | 6/2010 | Margomenos | |
| 7,855,696 B2 | 12/2010 | Gummalla | |
| 8,195,103 B2 | 6/2012 | Waheed | |
| 8,242,957 B2 | 8/2012 | Rofougaran | |
| 8,285,231 B2 | 10/2012 | Rofougaran | |
| 8,295,788 B2 | 10/2012 | Rofougaran | |
| 8,299,971 B2 | 10/2012 | Talty | |
| 2002/0000936 A1 * | 1/2002 | Sheen | 343/700 MS |
| 2002/0005807 A1 | 1/2002 | Sheen | |
| 2002/0041256 A1 | 4/2002 | Saitou | |
| 2002/0135568 A1 | 9/2002 | Chen | |
| 2003/0122729 A1 | 7/2003 | Diaz | |
| 2004/0066251 A1 | 4/2004 | Eleftheriades | |
| 2004/0203944 A1 | 10/2004 | Huomo | |
| 2004/0227668 A1 * | 11/2004 | Sievenpiper | 343/700 MS |
| 2004/0263378 A1 | 12/2004 | Jossef | |
| 2004/0263408 A1 * | 12/2004 | Sievenpiper et al. | 343/757 |
| 2005/0012667 A1 | 1/2005 | Noujeim | |
| 2005/0052283 A1 * | 3/2005 | Collins et al. | 340/572.7 |
| 2005/0052424 A1 | 3/2005 | Shih | |
| 2005/0116864 A1 | 6/2005 | Mohamadi | |
| 2005/0128155 A1 * | 6/2005 | Fukuda | 343/745 |
| 2005/0134579 A1 | 6/2005 | Hsieh | |
| 2005/0136972 A1 | 6/2005 | Smith | |
| 2006/0066326 A1 * | 3/2006 | Slupsky | 324/753 |
| 2006/0109127 A1 | 5/2006 | Barink | |
| 2006/0125703 A1 | 6/2006 | Ma | |
| 2006/0255499 A1 * | 11/2006 | Roeder et al. | 340/572.7 |
| 2006/0281423 A1 | 12/2006 | Caimi | |
| 2007/0171076 A1 | 7/2007 | Stevens | |
| 2007/0190952 A1 | 8/2007 | Waheed | |
| 2007/0273607 A1 | 11/2007 | Chen | |
| 2007/0285248 A1 * | 12/2007 | Hamel et al. | 340/572.1 |
| 2007/0287403 A1 | 12/2007 | Sjoland | |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258981 A1 | 10/2008 | Achour | |
| 2008/0278400 A1 | 11/2008 | Lohninger | |
| 2008/0284085 A1 | 11/2008 | Curina | |
| 2008/0316135 A1 * | 12/2008 | Hilgers | 343/795 |
| 2009/0066516 A1 * | 3/2009 | Lazo | 340/572.7 |
| 2009/0108996 A1 * | 4/2009 | Day | 340/10.1 |
| 2009/0160612 A1 * | 6/2009 | Varpula et al. | 340/10.1 |
| 2009/0251362 A1 | 10/2009 | Margomenos | |
| 2010/0110943 A2 * | 5/2010 | Gummalla et al. | 370/281 |
| 2010/0222105 A1 | 9/2010 | Nghiem | |
| 2010/0308668 A1 | 12/2010 | Rofougaran | |
| 2010/0308767 A1 | 12/2010 | Rofougaran | |
| 2010/0308885 A1 | 12/2010 | Rofougaran | |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 | 12/2010 | Rofougaran | |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Rofougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 | 12/2010 | Rofougaran | |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 | 12/2010 | Rofougaran | |
| 2010/0311493 A1 | 12/2010 | Miller | |
| 2012/0095531 A1 * | 4/2012 | Derbas et al. | 607/68 |
| 2012/0153731 A9 * | 6/2012 | Kirby et al. | 307/104 |
| 2012/0263256 A1 | 10/2012 | Waheed | |

OTHER PUBLICATIONS

Grbic et al (Leaky CPW-based Slot Antenna Array for Millimeter-Wave Applications, IEEE Trans. on Antenna and Propagation, vol. 50, No. 11, Nov. 2002.*

Feresidis et al., "Flat Plate Millimetre Wave Antenna Based on Partially Reflective FSS", 11th International Conference on Antennas and Propagation, 2001, pp. 33-36.

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity Antennas", Electronics Letters, 2007.

Kimoto et al., "On-Chip Wireless Signal Transmission using Silicon Integrated Antennas", Measurement 40, No. 30, (2004): 20.

Iyer et al., "Wireless chip to chip interconnections for multichip modules using leaky wave antennas", Nov. 1993, pp. 2030-2031.

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

Floyd et al., "Wireless Interconnects for Clock Distribution", pp. 105-108, 2002.

Zvolensky et al., "Leaky-Wave antenna based on micro-electromechanical systems-loaded microstrip line", 2011, pp. 357-363.

* cited by examiner

METHOD AND SYSTEM FOR POWER TRANSFER UTILIZING LEAKY WAVE ANTENNAS

CROSS-REFERENCE TO RELATED APPLICATIONS/INCORPORATION BY REFERENCE

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009;
U.S. patent application Ser. No. 12/650,324 filed on Dec. 30, 2009;
U.S. patent application Ser. No. 12/708,366 filed on Feb. 18, 2010;
U.S. patent application Ser. No. 12/751,550 filed on Mar. 31, 2010;
U.S. patent application Ser. No. 12/751,768 filed on Mar. 31, 2010;
U.S. patent application Ser. No. 12/751,759 filed on Mar. 31, 2010;
U.S. patent application Ser. No. 12/751,593 filed on Mar. 31, 2010;
U.S. patent application Ser. No. 12/751,772 filed on Mar. 31, 2010;
U.S. patent application Ser. No. 12/751,777 filed on Mar. 31, 2010;
U.S. patent application Ser. No. 12/751,782 filed on Mar. 31, 2010;
U.S. patent application Ser. No. 12/751,792 filed on Mar. 31, 2010;
U.S. patent application Ser. No. 12/790,279 filed on May 28, 2010;
U.S. patent application Ser. No. 12/797,029 filed on even date herewith;
U.S. patent application Ser. No. 12/797,133 filed on even date herewith;
U.S. patent application Ser. No. 12/797,162 filed on even date herewith;
U.S. patent application Ser. No. 12/797,177 filed on even date herewith;
U.S. patent application Ser. No. 12/797,203 filed on even date herewith;
U.S. patent application Ser. No. 12/796,822 filed on even date herewith;
U.S. patent application Ser. No. 12/796,841 filed on even date herewith;
U.S. patent application Ser. No. 12/797,232 filed on even date herewith;
U.S. patent application Ser. No. 12/796,862 filed on even date herewith;
U.S. patent application Ser. No. 12/796,975 filed on even date herewith;
U.S. patent application Ser. No. 12/797,041 filed on even date herewith;
U.S. patent application Ser. No. 12/797,112 filed on even date herewith;
U.S. patent application Ser. No. 12/797,254 filed on even date herewith;
U.S. patent application Ser. No. 12/797,273 filed on even date herewith; and
U.S. patent application Ser. No. 12/797,316 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for power transfer utilizing leaky wave antennas.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for power transfer utilizing leaky wave antennas as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for power transfer utilizing leaky wave antennas. Exemplary aspects of the invention may comprise configuring one or more leaky wave antennas in a communication device to receive RF signals that are communicated from one or more other leaky wave antennas that are external to the communication device. The communication device may be powered utilizing the RF signals that are received via the configured one or more leaky wave antennas. A resonant frequency of the one or more leaky wave antennas may be configured utilizing micro-electro-mechanical systems (MEMS) deflection. The one or more leaky wave antennas may be configured to receive the RF signals from a desired direction. The one or more leaky wave antennas may comprise microstrip waveguides, wherein a cavity height of the one or more leaky wave antennas is dependent on spacing between conductive lines in the microstrip waveguides. The one or more leaky wave antennas may comprise coplanar waveguides, wherein a cavity height of the one or more leaky wave antennas is dependent on spacing between conductive lines in the coplanar waveguides. The received RF signals may be rectified via cascaded rectifier cells to generate the one or more DC voltages. The one or more leaky wave antennas may be integrated in one or more integrated circuits, integrated circuit packages, and or printed circuit boards. The integrated circuit packages may be affixed, by flip-chip bonding, for example, to one or more printed circuit boards and the one or more integrated circuits may be flip-chip-bonded to the one or more of the integrated circuit packages.

Figure 1:
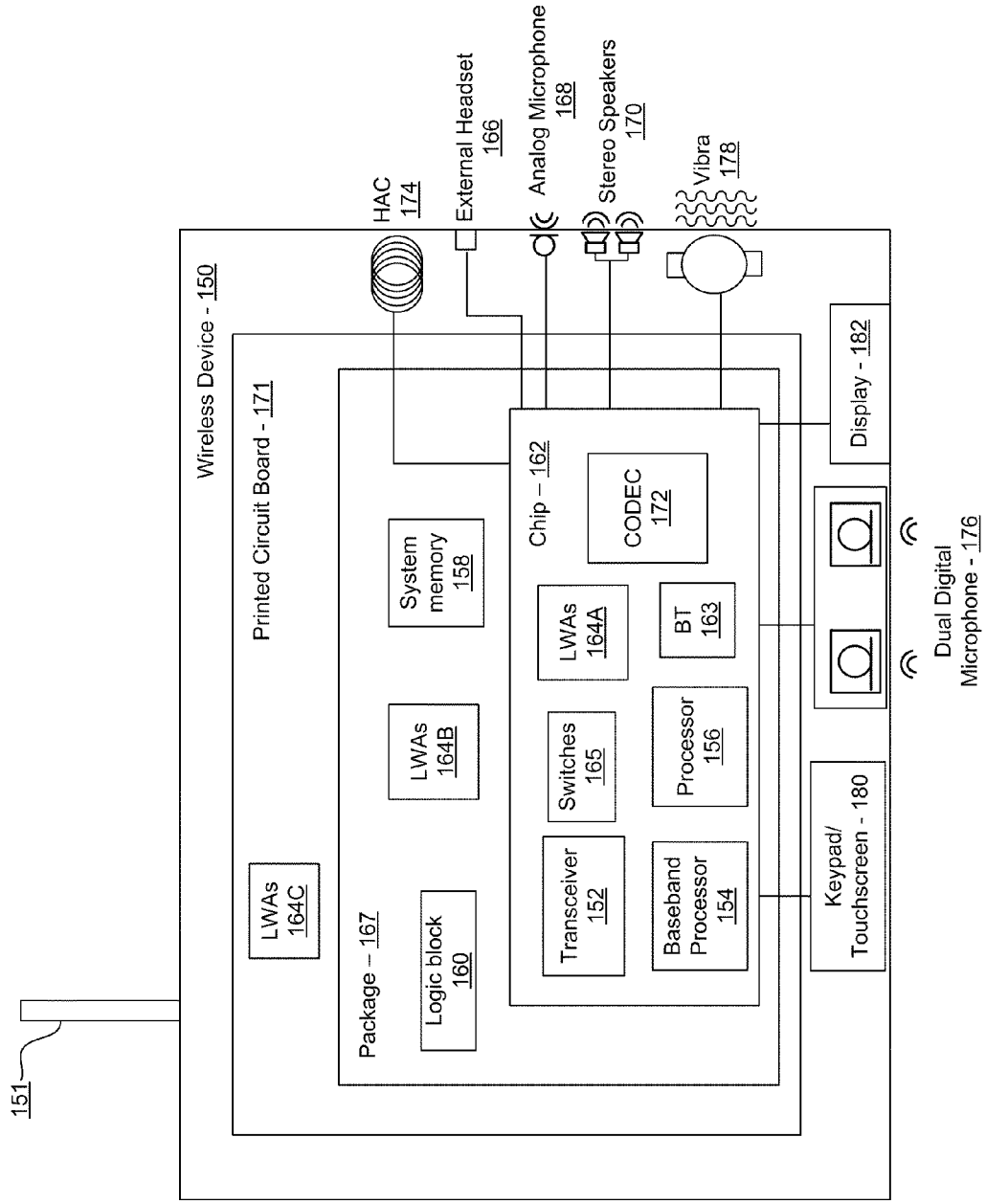
FIG. 1 is a block diagram of an exemplary wireless system with leaky wave antennas for power transfer, which may be utilized in accordance with an embodiment of the invention.

FIG. 1 is a block diagram of an exemplary wireless system with leaky wave antennas for power transfer, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A-164C, switches 165, an external headset port 166, and an integrated circuit package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A-164C. Different wireless systems may use different antennas for transmission and reception. The transceiver 152 may be enabled to execute other functions, for example, filtering the baseband and/or RF signals, and/or amplifying the baseband and/or RF signals. In an exemplary embodiment of the invention, the transceiver 152 may be operable to convert a received RF signal to power for use in the wireless device 150, and may comprise on-chip, on-package, and/or on printed-circuit board components that may be operable to generate DC power through rectification of RF AC signals and charging storage elements such as CMOS capacitors, for example.

Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example.

The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, and the CODEC 172. The number of functional blocks integrated in the chip 162 is not limited to the number shown in FIG. 1. Accordingly, any number of blocks may be integrated on the chip 162 depending on chip space and wireless device 150 requirements, for example. The chip 162 may be flip-chip bonded, for example, to the package 167, as described further with respect to FIG. 8.

The leaky wave antennas 164A-164C may comprise a resonant cavity with a highly reflective surface and a lower reflectivity surface, and may be integrated in and/or on the chip 162, the package 167, and/or the printed circuit board 171. The lower reflectivity surface may allow the resonant mode to "leak" out of the cavity. The lower reflectivity surface of the leaky wave antennas 164A-164C may be configured with slots in a metal surface, or a pattern of metal patches, as described further in FIGS. 2 and 3. The physical dimensions of the leaky wave antennas 164A-164C may be configured to optimize bandwidth of transmission and/or the beam pattern radiated. By integrating the leaky wave antennas 164B and 164C on the package 167 and/or the printed circuit board 171, the dimensions of the leaky wave antennas 164B and 164C may not be limited by the size of the chip 162.

In an exemplary embodiment of the invention, the leaky wave antennas 164A-164C may be operable to transmit and/or receive RF signals, and may enable the transfer of power between wireless devices. For example, another wireless device that is coupled to a fixed power source, such as an electrical outlet for example, may communicate RF signals for transferring power to the wireless device 150 via leaky wave antennas.

Figure 3:
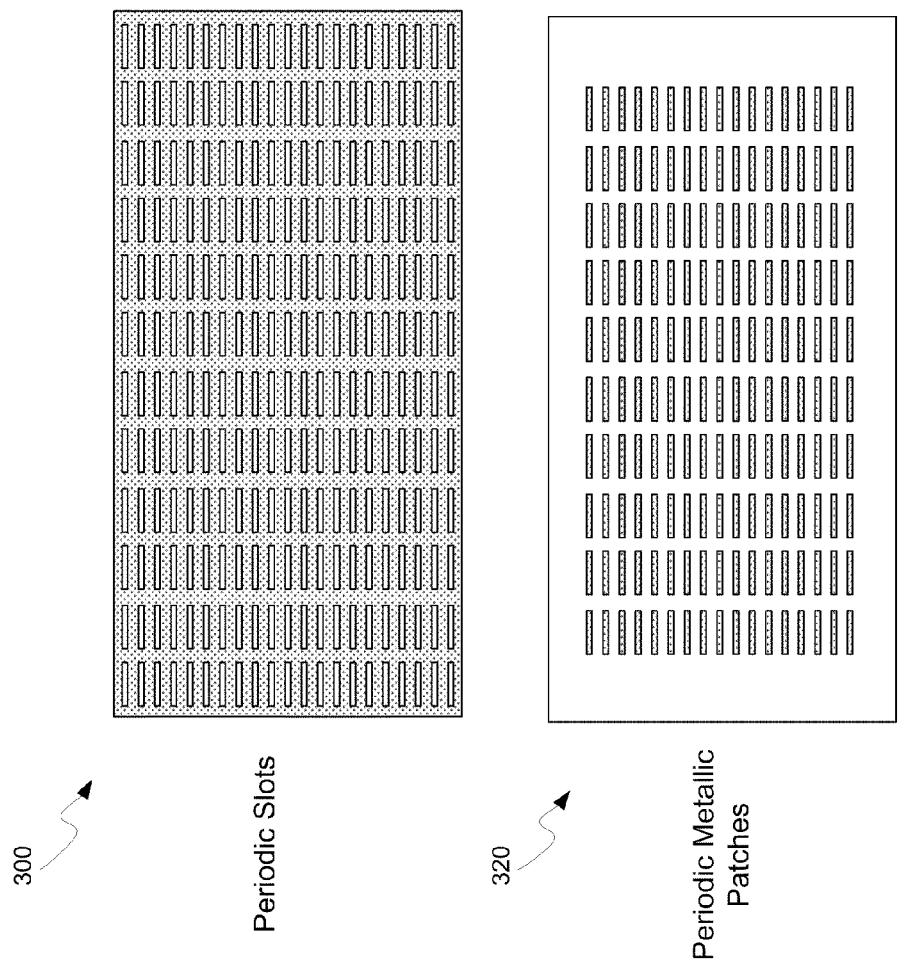
FIG. 3 is a block diagram illustrating a plan view of exemplary partially reflective surfaces, in accordance with an embodiment of the invention.

The switches 165 may comprise switches such as CMOS or MEMS switches that may be operable to switch different antennas of the leaky wave antennas 164 to the transceiver 152 and/or switch elements in and/or out of the leaky wave antennas 164, such as the patches and slots described in FIG. 3.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The leaky wave antennas 164A-164C may be operable to transmit and/or receive wireless signals. RF signals may be utilized to transfer power between devices with leaky wave antennas. Received RF signals may then be converted to DC power for use in the receiving device. In this manner, power may be supplied by devices external to the wireless device 150. Resonant cavities may be configured between reflective surfaces in and/or on the package 167 so that signals may be transmitted and/or received from any location on the package 167 without requiring large areas needed for conventional antennas and associated circuitry.

The frequency of the transmission and/or reception may be determined by the cavity height of the leaky wave antennas 164A-164C. Accordingly, the reflective surfaces may be integrated at different heights or lateral spacing in the package 167, thereby configuring leaky wave antennas with different resonant frequencies.

In an exemplary embodiment of the invention, the resonant cavity frequency of the leaky wave antennas 164A-164C may be configured by tuning the cavity height using MEMS actuation. Accordingly, a bias voltage may be applied such that one or both of the reflective surfaces of the leaky wave antennas 164A-164C may be deflected by the applied potential. In this manner, the cavity height, and thus the resonant frequency of the cavity, may be configured. Similarly, the patterns of slots and/or patches in the partially reflected surface may be configured by the switches 165.

Different frequency signals may be transmitted and/or received by the leaky wave antennas 164A-164C by selectively coupling the transceiver 152 to leaky wave antennas with different cavity heights. For example, leaky wave antennas with reflective surfaces on the top and the bottom of the package 167 may have the largest cavity height, and thus provide the lowest resonant frequency. Conversely, leaky wave antennas with a reflective surface on the surface of the package 167 and another reflective surface just below the surface of the package 167, may provide a higher resonant frequency. The selective coupling may be enabled by the switches 165 and/or CMOS devices in the chip 162.

Figure 2:
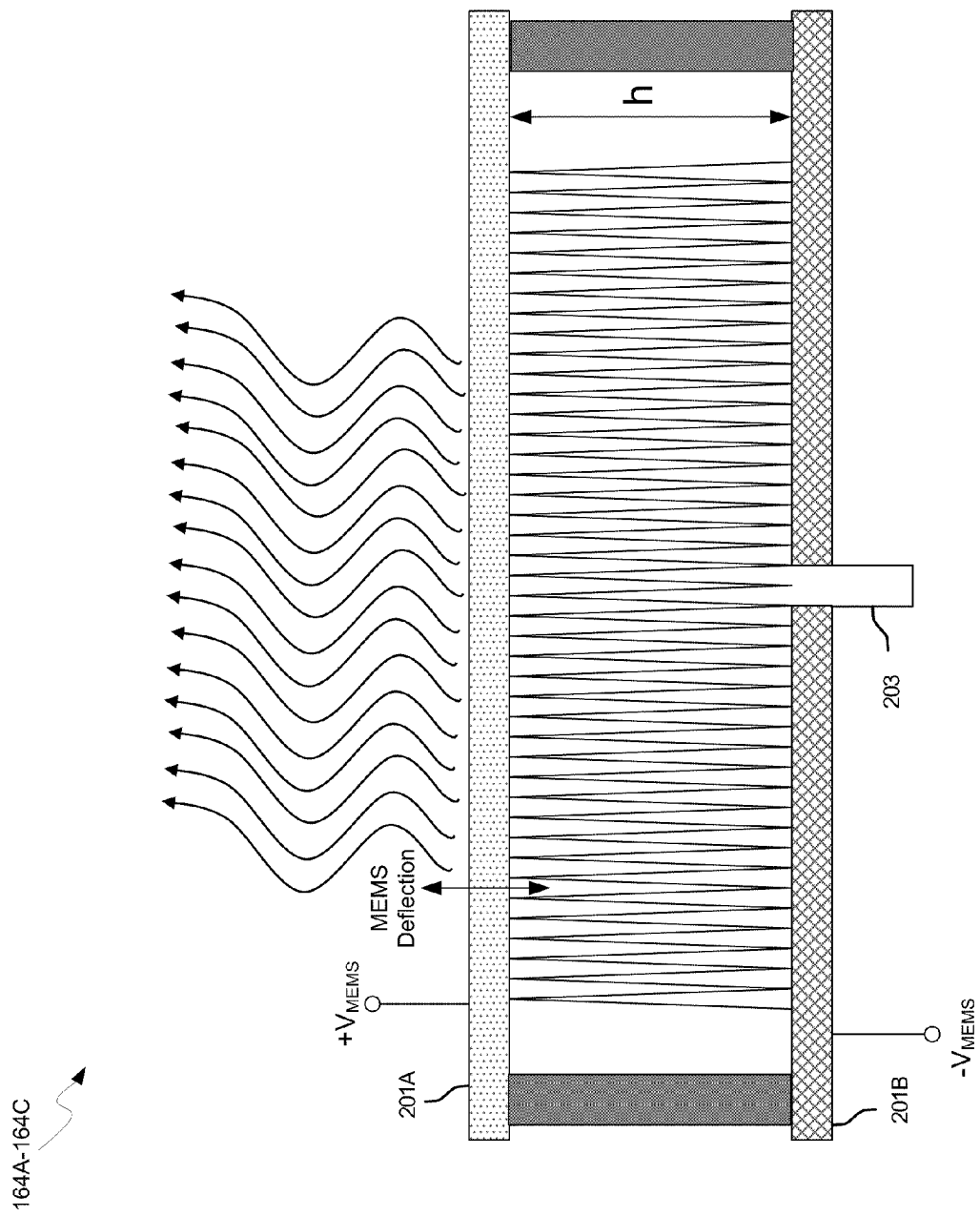
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antennas 164A-164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antennas 164A-164C. In another embodiment of the invention, an air gap may be integrated in the space between the partially reflective surface 201A and the reflective surface 201B to enable MEMS actuation. There is also shown (microelectromechanical systems) MEMS bias voltages, $+V_{MEMS}$ and $-V_{MEMS}$.

The feed point 203 may comprise an input terminal for applying an input voltage to the leaky wave antennas 164A-164C. The invention is not limited to a single feed point 203, as there may be any amount of feed points for different phases of signal or a plurality of signal sources, for example, to be applied to the leaky wave antennas 164A-164C.

In an embodiment of the invention, the height, h, may be one-half the wavelength of the desired transmitted mode from the leaky wave antennas 164A-164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antennas 164A-164C. The input impedance of the leaky wave antennas 164A-164C may be configured by the vertical placement of the feed point 203, as described further in FIG. 6.

In operation, a signal to be transmitted via a power amplifier in the transceiver 152 may be communicated to the feed point 203 of the leaky wave antennas 164A-164C with a frequency f, or a signal to be received by the leaky wave antennas 164A-164C may be directed at the antenna. The cavity height, h, may be configured to correlate to one half the wavelength of a harmonic of the signal of frequency f. The signal may traverse the height of the cavity and may be reflected by the partially reflective surface 201A, and then traverse the height back to the reflective surface 201B. Since the wave will have traveled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. Due to the high gain of leaky wave antennas, they may be utilized to transfer power via RF signals between wireless devices. The leaky wave antennas 164A-164C may be operable to transmit and/or receive wireless signals via conductive layers in and/or on the package 167.

The resonant frequency of the cavity may cover a wider range due to the larger size of the package 167, compared to the chip 162, without requiring large areas needed for conventional antennas and associated circuitry. In addition, by integrating leaky wave antennas in a plurality of packages on one or more printed circuit boards, wireless communication between packages may be enabled.

In an exemplary embodiment of the invention, the frequency of transmission and/or reception of the leaky wave antennas 164A-164C may be configured by selecting one of the leaky wave antennas 164A-164C with the appropriate cavity height for the desired frequency.

In another embodiment of the invention, the cavity height, h, may be configured by MEMS actuation. For example, the bias voltages $+V_{MEMS}$ and $-V_{MEMS}$ may deflect one or both of the reflective surfaces 201A and 201B compared to zero bias, thereby configuring the resonant frequency of the cavity.

The leaky wave antennas 164A-164C may transfer power between wireless devices. For example, a wireless device that is coupled to a fixed power source, such as an electrical outlet for example, may communicate RF signals for transferring power to the wireless device 150 via leaky wave antennas. In this manner, the wireless device 150 may operate without a battery or with reduced power storage capabilities.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via CMOS and/or micro-electromechanical system (MEMS) switches, such as the switches 165 described with respect to FIG. 1, to tune the Q of the resonant cavity. The slots and/or patches may be configured in conductive layers in and/or on the package 167 and may be shorted together or switched open utilizing the switches 165. In this manner, RF signals, such as 60 GHz signals, for example, may be transmitted from various locations without the need for additional circuitry and conventional antennas with their associated circuitry that require valuable chip space.

In another embodiment of the invention, the slots or patches may be configured in conductive layers in a vertical plane of the chip 162, the package 167, and/or the printed circuit board 171, thereby enabling the communication of wireless signals in a horizontal direction in the structure.

In another exemplary embodiment of the invention, the partially reflective surfaces 300/320 may be integrated in and/or on the package 167. In this manner, different frequency signals may be transmitted and/or received. Accordingly, a partially reflective surface 300/320 integrated within the package 167 and a reflective surface 201B may transmit and/or receive signals at a higher frequency signal than from a resonant cavity defined by a partially reflective surface 300/320 on surface of the package 167 and a reflective surface 201B on the other surface of the package 167.

Figure 4:
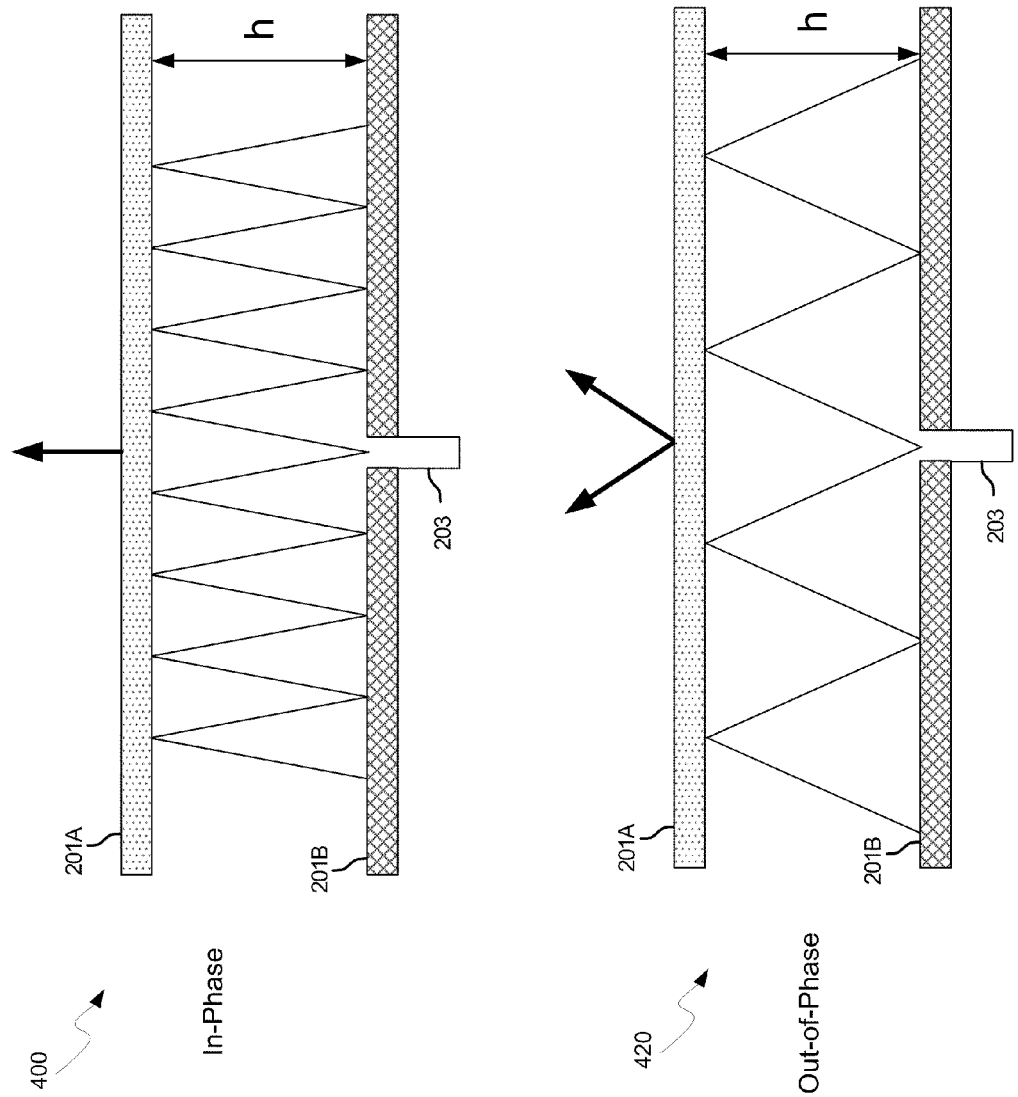
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partially reflective surface 201A, the reflective surface 201B, and the feed point 203. In-phase condition 400 illustrates the relative beam shape transmitted by the leaky wave antennas 164A-164C when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antennas 164A-164C when the frequency of the signal communicated to the feed point 203 does not match that of the resonant cavity. The resulting beam shape may be conical, as opposed to a single main vertical node. These are illustrated further with respect to FIG. 5. The leaky wave antennas 164A-164C may be integrated at various heights in the package 167, thereby providing a plurality of transmission and reception sites in the package 167 with varying resonant frequency.

By configuring the leaky wave antennas for in-phase and out-of-phase conditions, signals possessing different characteristics may be directed out of and/or into the package 167 in desired directions, thereby enabling wireless communication between a plurality of packages or devices. In an exemplary embodiment of the invention, the angle at which signals may be transmitted by a leaky wave antenna may be dynamically controlled so that signal may be directed to desired receiving leaky wave antennas. In another embodiment of the invention, the leaky wave antennas 164A-164C may be operable to receive RF signals, such as 60 GHz signals, for example. The direction in which the signals are received may be configured by the in-phase and out-of-phase conditions.

In an exemplary embodiment of the invention, by configuring the leaky wave antennas to transmit and/or receive RF signals from any desired direction, the wireless device 150 may then be operable to receive RF power from other wireless devices with leaky wave antennas and generate DC power for use in the wireless device 150.

Figure 5:
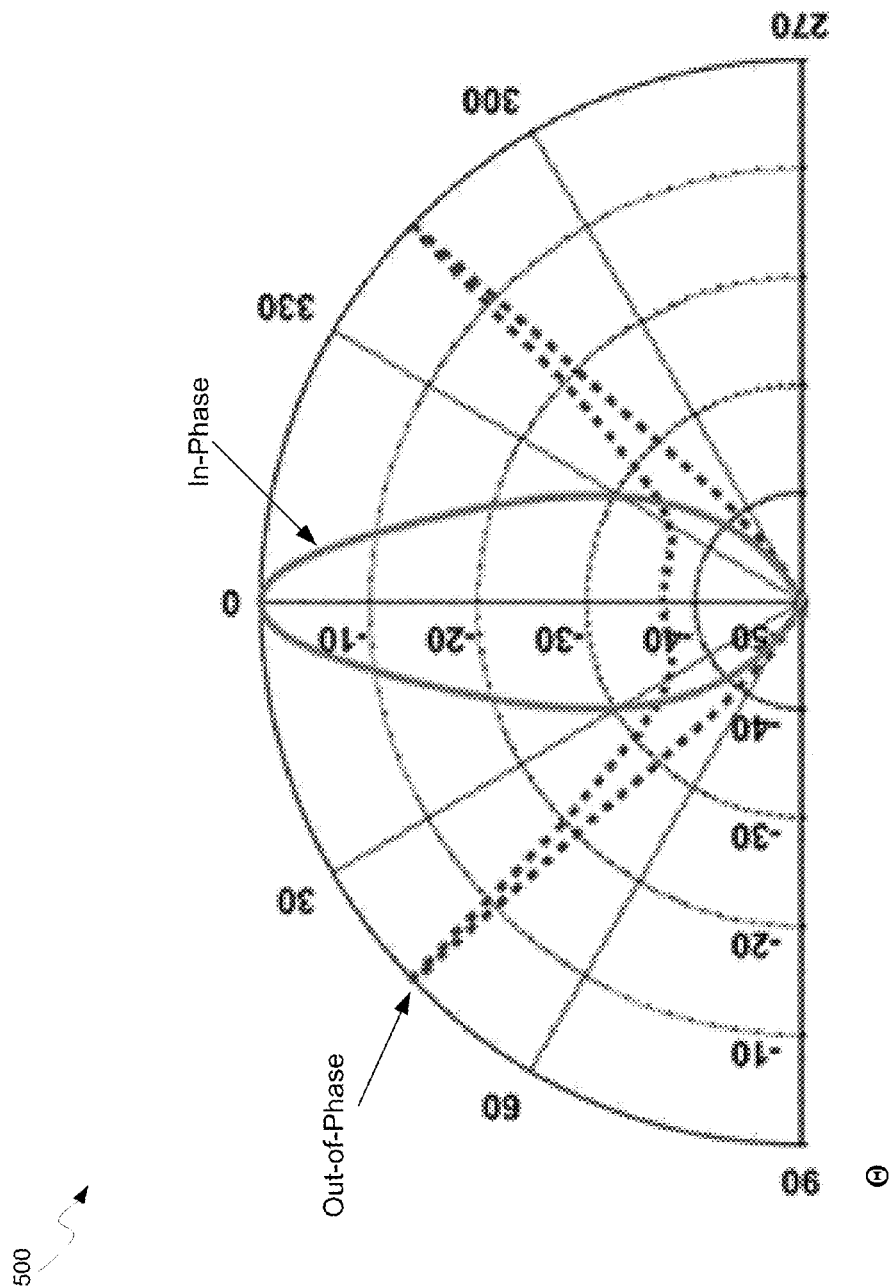
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, Θ, for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, signals may be directed out of the chip 162, package 167, and/or the printed circuit board 171 in desired directions.

In another embodiment of the invention, the leaky wave antennas 164A-164C may be operable to receive wireless signals, and may be configured to receive from a desired direction via the in-phase and out-of-phase configurations. In this manner, power may be generated from RF signals transmitted by other wireless devices and received from a plurality of directions by the leaky wave antennas 164A-164C.

Figure 6:
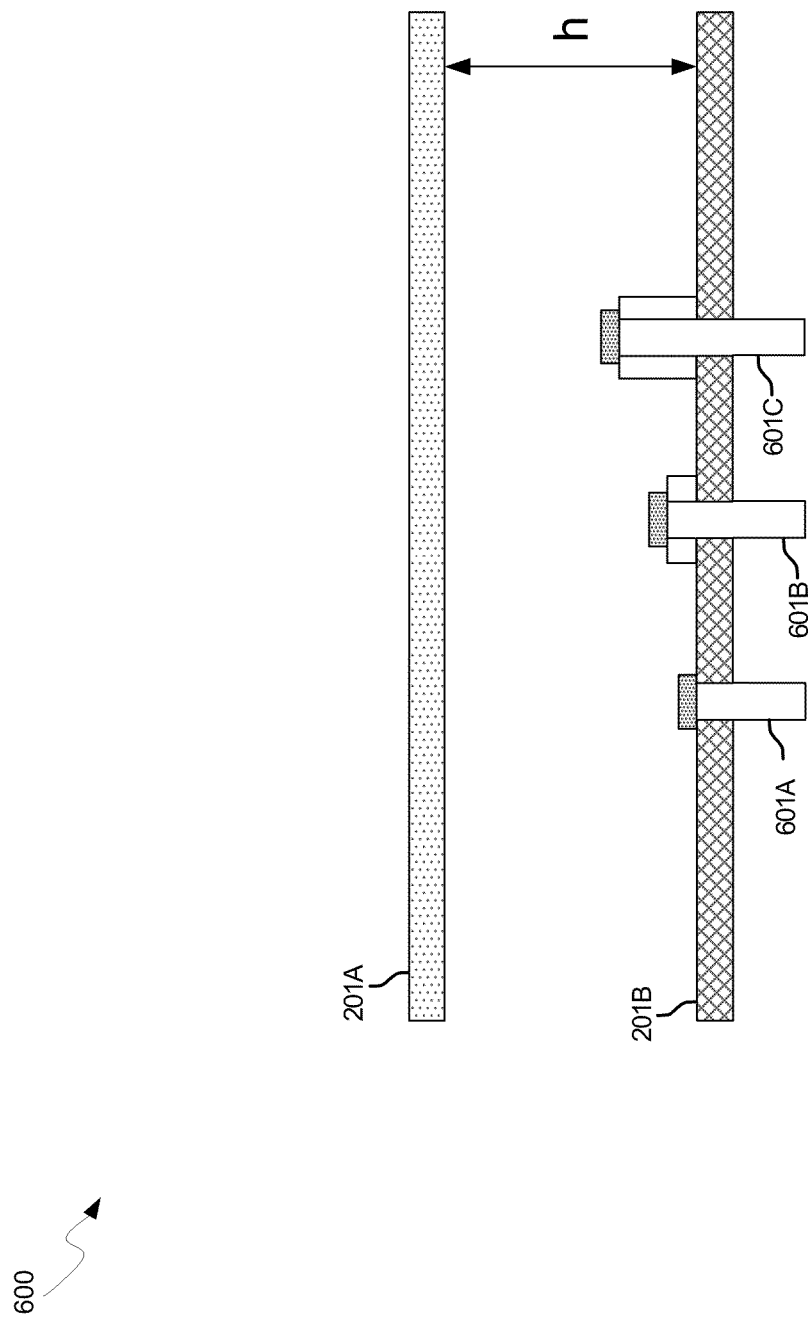
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may be utilized to couple to a plurality of power amplifiers, low-noise amplifiers, and/or other circuitry with varying output or input impedances. Similarly, by integrating leaky wave antennas in conductive layers in the chip 162, the package 167, and/or the printed circuit board 171, the impedance of the leaky wave antenna may be matched to the power amplifier or low-noise amplifier without impedance variations that may result with conventional antennas and their proximity or distance to associated driver electronics. In addition, by integrating reflective and partially reflective surfaces with varying cavity heights and varying feed points, leaky wave antennas with different impedances and resonant frequencies may be enabled. In an embodiment of the invention, the heights of the feed points 601A-601C may be configured by MEMS actuation.

Figure 7:
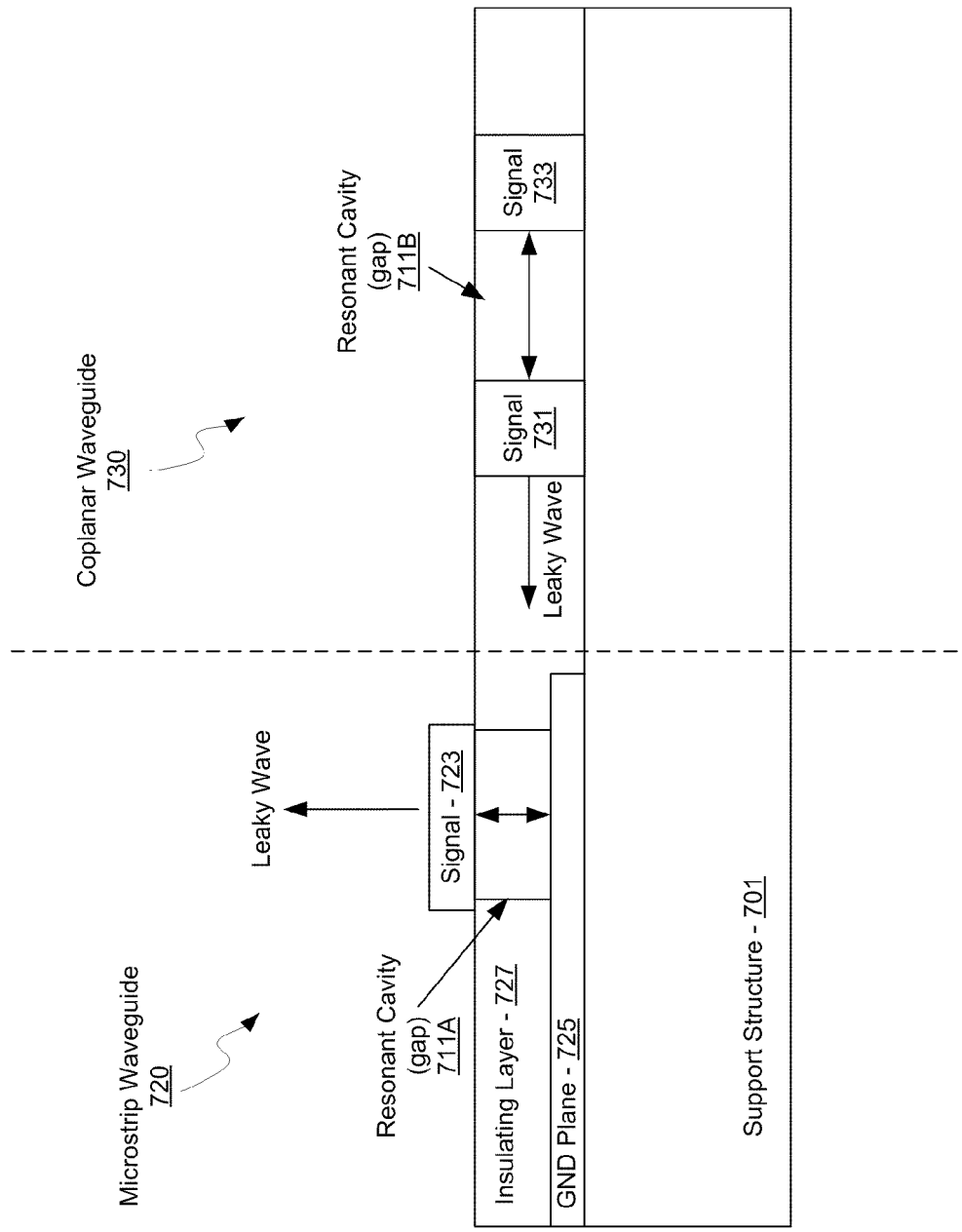
FIG. 7 is a block diagram illustrating a cross-sectional view of coplanar and microstrip waveguides, in accordance with an embodiment of the invention.

FIG. 7 is a block diagram illustrating a cross-sectional view of coplanar and microstrip waveguides, in accordance with an embodiment of the invention. Referring to FIG. 7, there is shown a microstrip waveguide 720 and a coplanar waveguide 730 and a support structure 701. The microstrip waveguide 720 may comprise signal conductive lines 723, a ground plane 725, a resonant cavity 711A, and an insulating layer 727. The coplanar waveguide 730 may comprise signal conductive lines 731 and 733, a resonant cavity 711B, the insulating layer 727, and a multi-layer support structure 701. The support structure 701 may comprise the chip 162, the package 167, and/or the printed circuit board 171, for example.

The signal conductive lines 723, 731, and 733 may comprise metal traces or layers deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The resonant cavities 711A and 711B may comprise the insulating layer 727, an air gap, or a combination of an air gap and the insulating layer 727, thereby enabling MEMS actuation and thus frequency tuning.

The insulating layer 727 may comprise $SiO_2$ or other insulating material that may provide a high resistance layer between the signal conductive line 723 and the ground plane 725, and the signal conductive lines 731 and 733. In addition, the electric field between the signal conductive line 723 and the ground plane 725 may be dependent on the dielectric constant of the insulating layer 727.

The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the signal conductive lines 731 and 733, for example.

The signal conductive lines 731 and 733, and the signal conductive line 723 and the ground plane 725 may define resonant cavities for leaky wave antennas. Each layer may comprise a reflective surface or a partially reflective surface depending on the pattern of conductive material. For example, a partially reflective surface may be configured by alternating conductive and insulating material in a desired pattern. In this manner, signals may be directed out of, or received into, a surface of the chip 162, the package 167, and/or the printed circuit board 171, as illustrated with the microstrip waveguide 720. In another embodiment of the invention, signals may be communicated in the horizontal plane of the chip 162, the package 167, and/or the printed circuit board 171 utilizing the coplanar waveguide 730.

The support structure 701 may provide mechanical support for the microstrip waveguide 720, the coplanar waveguide 730, and other devices that may be integrated within. In another embodiment of the invention, the chip 162, the package 167, and/or the printed circuit board 171 may comprise Si, GaAs, sapphire, InP, GaO, ZnO, CdTe, CdZnTe, ceramics, polytetrafluoroethylene, and/or $Al_2O_3$, for example, or any other substrate material that may be suitable for integrating microstrip structures.

In operation, a bias and/or a signal voltage may be applied across the signal conductive line 723 and the ground plane 725, and/or the signal conductive lines 731 and 733. The thickness of a leaky wave antenna resonant cavity may be dependent on the distance between the conductive lines in the microstrip waveguide 720 and/or the coplanar transmission waveguide 730.

By alternating patches of conductive material with insulating material, or slots of conductive material in dielectric material, a partially reflective surface may result, which may allow a signal to "leak out" in that direction, as shown by the Leaky Wave arrows in FIG. 7. In this manner, wireless signals may be directed in to or out of the surface plane of the support structure 710, or parallel to the surface of the support structure 710.

Similarly, by sequentially placing the conductive signal lines 731 and 733 with different spacing, different cavity heights may result, and thus different resonant frequencies, thereby forming a distributed leaky wave antenna. In this manner, a plurality of signals at different frequencies may be transmitted from, or received by, the distributed leaky wave antenna.

By integrating the conductive signal lines 731 and 733 and the ground plane 725 in the package 167, wireless signals may be received by the package 167. Wireless signals may be communicated packages in the horizontal or vertical planes depending on which type of leaky wave antenna is enabled, such as a coplanar or microstrip structure. In an exemplary embodiment of the invention, the leaky wave antennas defined by the microstrip wave guide 720 and/or the coplanar waveguide 730 may be operable to receive RF signals transmitted by other wireless devices that may be utilized to generate power for use in the wireless device 150.

Figure 8:
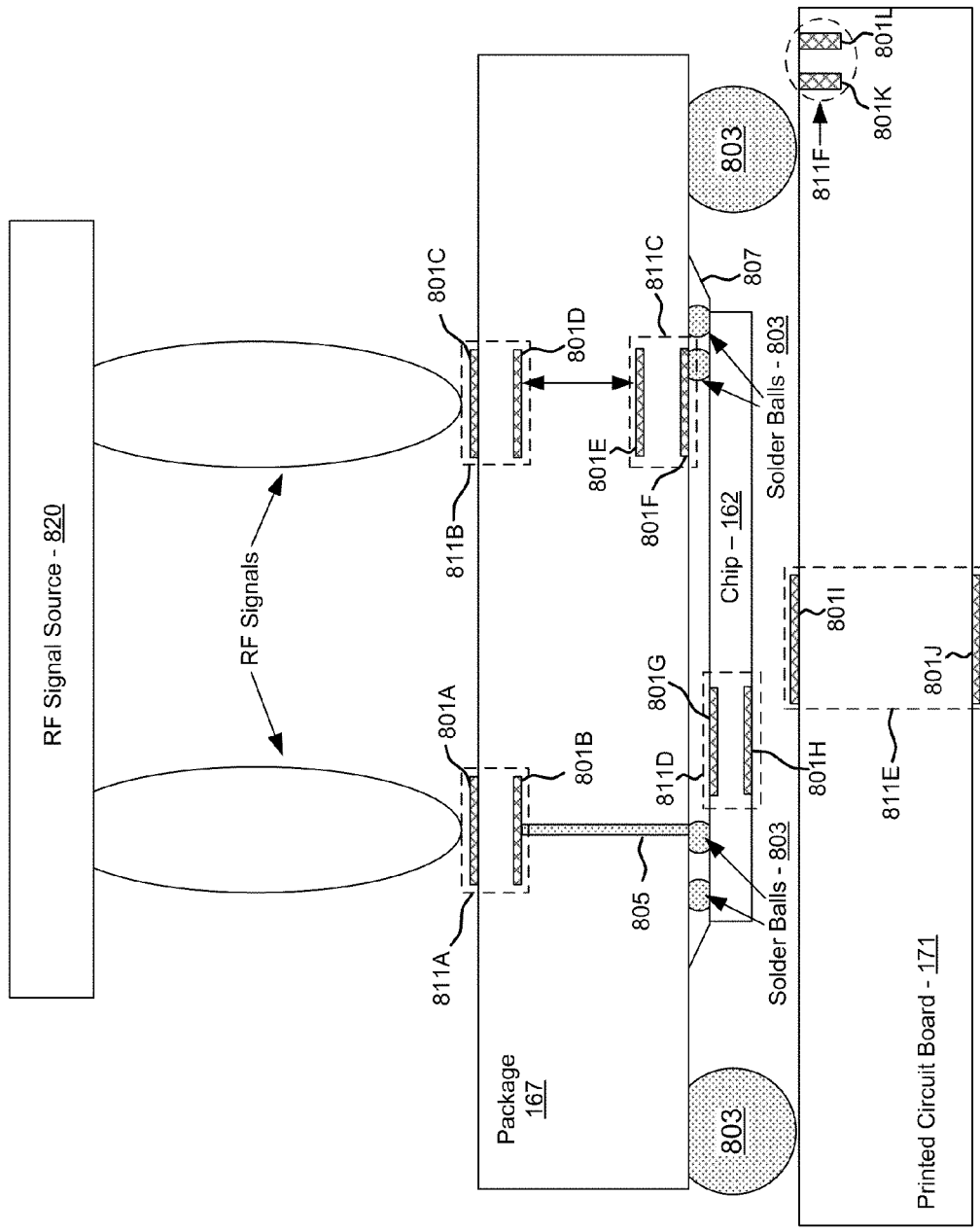
FIG. 8 is a diagram illustrating a cross-sectional view of an integrated circuit package with integrated leaky wave antennas for transferring power via RF signals, in accordance with an embodiment of the invention.

FIG. 8 is a diagram illustrating a cross-sectional view of an integrated circuit package with integrated leaky wave antennas for transferring power via RF signals, in accordance with an embodiment of the invention. Referring to FIG. 8, there is shown the package 167, metal layers 801A-801L, solder balls 803, an interconnect layer 805, thermal epoxy 807, leaky wave antennas 811A-811F, and an RF signal source 820. The chip 162 and the printed circuit board 171 may be as described previously.

The chip 162, or integrated circuit, may comprise one or more components and/or systems within the wireless system 150. The chip 162 may be bump-bonded or flip-chip bonded to the package 167 utilizing the solder balls 803. In this manner, wire bonds connecting the chip 162 to the package 167 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167.

The metal layers 801A-801L may comprise deposited metal layers utilized to delineate leaky wave antennas in and/or on the chip 162, the package 167, and/or the printed circuit board 171. In an embodiment of the invention, the spacing between pairs of metal layers, for example 801A and 801B, 801C and 801D, and 801E and 801F, may define a resonant cavity of a leaky wave antenna with cavity heights determined by the spacing between the metal layers. In this regard, a partially reflective surface, as shown in FIGS. 2 and 3, for example, may enable the resonant electromagnetic mode in the cavity to leak out from that surface.

The metal layers 801A-801J may comprise a microstrip structure and the metal layers 801K and 801L may comprise a coplanar waveguide structure as described with respect to FIG. 7. The interconnect layer 805 may comprise conductive material that may provide electrical contact to the leaky wave antenna 811A and other layers and/or devices in the package 167.

The number of metal layers is not limited to the number of metal layers 801A-801L shown in FIG. 8. Accordingly, there may be any number of layers embedded within and/or on the package 167, depending on the number of leaky wave antennas, traces, waveguides and other devices fabricated within and/or on the package 167.

The solder balls 803 may comprise spherical balls of metal to provide electrical, thermal and physical contact between the chip 162, the package 167, and/or the printed circuit board 171. In making the contact with the solder balls 803, the chip 162 and/or the package 167 may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162.

The RF signal source 820 may comprise a wireless device with one or more leaky wave antennas that may be operable to communicate RF signals to the leaky wave antennas 811A-811F, depending on the direction of the source with respect to the wireless device 150. For example, the RF signal source 820 may comprise an access point located above the wireless device 150, thereby aligning with the leaky wave antennas 811A-811E, but perpendicular to the leaky wave antenna 811F.

In operation, the chip 162 may comprise an RF front end, such as the RF transceiver 152, described with respect to FIG. 1, and may be utilized to transmit and/or receive RF signals, at 60 GHz, for example. The chip 162 may be electrically coupled to the package 167. Leaky wave antennas comprising the metal layers 801A-801L integrated on or within the chip 162, the package 167, and/or printed circuit board 171 may be enabled to receive RF signals that may be utilized to generate power for use in the wireless device. For example, the wireless device 150 may be operable to generate one or more DC voltages utilizing RF-to-DC circuitry, as described with respect to FIG. 9. Additionally, by utilizing a plurality of leaky wave antennas with configurable direction of reception, RF signals from any direction may be utilized to transfer power among wireless devices.

Heat from the chip 162 may be conducted to the package 167 via the thermal epoxy 807 and the solder balls 803. In an embodiment of the invention, the metal layers 801A-801G may be configured at different heights in the package 167 enabling the configuration of leaky wave antennas with different resonant frequencies.

The leaky wave antennas 811A-811F comprising the metal layers 801A-801L may be configured by adjusting the spacing between the pairs of metal layers comprising a resonant cavity, and may be configurable via MEMS actuation, as described with respect to FIG. 2. Accordingly, the cavity height of a leaky wave antenna may be defined by a MEMS switch such that applying a bias may increase or decrease the spacing, thereby further configuring the resonant frequency of the leaky wave antenna. In addition, the slots and/or patches in the metal layer comprising a partially reflective surface for the leaky wave antenna, may be configured via one or more switches, which may alter the Q-factor of the cavity. In this manner, the communication parameters of leaky wave antennas integrated into the chip 162, the package 167, and/or the printed circuit board 171 may be configured for a plurality of applications.

The integration of leaky wave antennas in the chip 162, the package 167, and/or the printed circuit board 171, may result in the reduction of stray impedances when compared to wire-bonded connections to discrete devices on printed circuit boards as in conventional systems, particularly for higher frequencies, such as 60 GHz. In this manner, volume requirements may be reduced and performance may be improved due to lower losses and accurate control of impedances via switches in the chip 162 or on the package 167, for example.

In an exemplary embodiment of the invention, by configuring the leaky wave antennas 811A-811F to transmit and/or receive RF signals from any desired direction, the wireless device 150 may then be operable to transfer RF power to other wireless devices with leaky wave antennas. Accordingly, received RF signals may be utilized to generate DC power for use in the wireless device 150.

Figure 9:
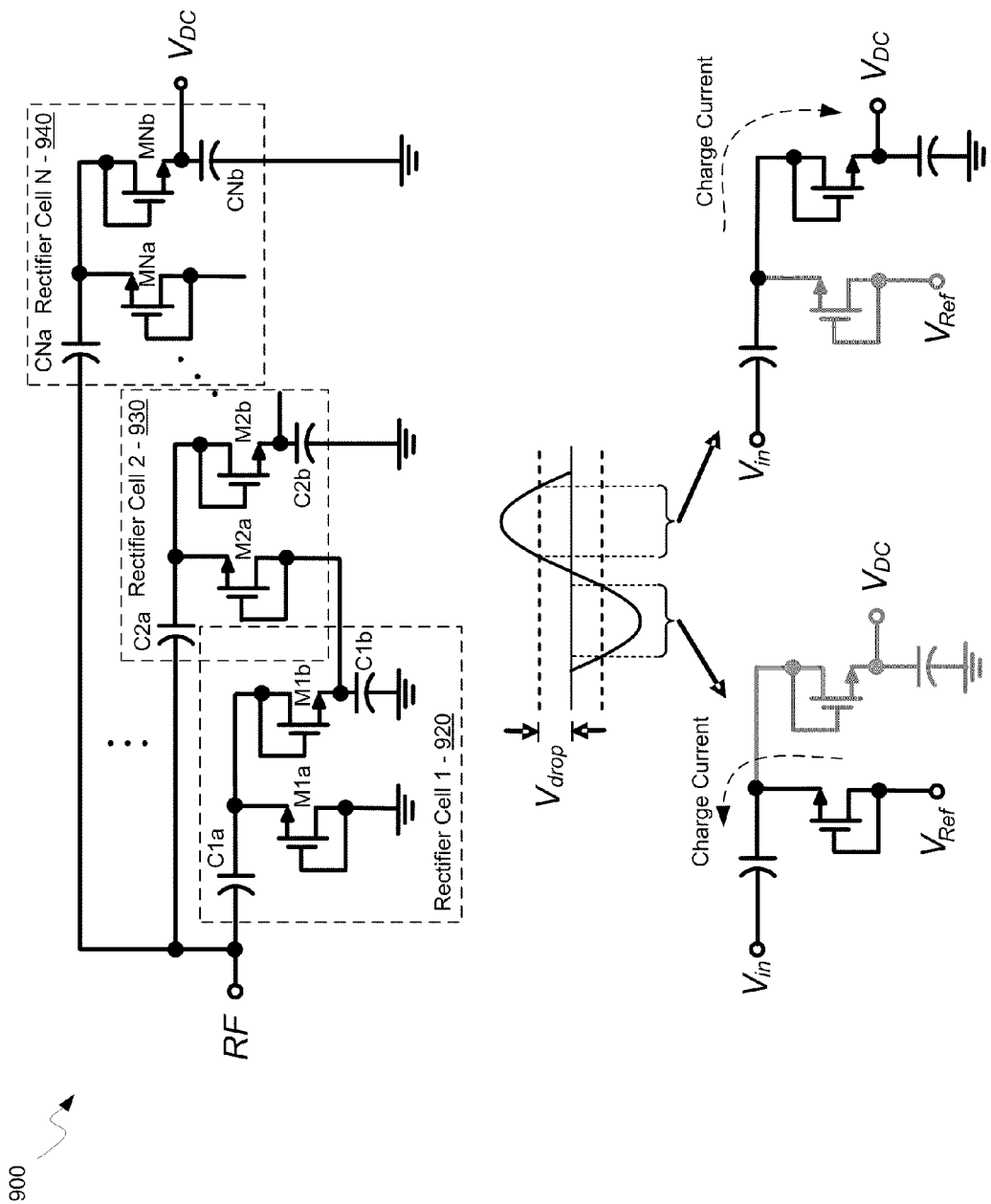
FIG. 9 is a block diagram illustrating an exemplary RF to DC module, in accordance with an embodiment of the invention.

FIG. 9 is a block diagram illustrating an exemplary RF to DC module, in accordance with an embodiment of the invention. Referring to FIG. 9, there is shown an RF-to-DC converter 900 comprising CMOS transistors M1a, M1b, M2a, M2b, MNa, and MNb, and capacitors C1a, C1b, C2a, C2b, CNa, and CNb. There is also shown an input RF signal and an output voltage DC. The element references MNc and MNd indicate that the RF-to-DC converter 900 may comprise N stages, where N is an integer. The capacitors and CMOS transistors may comprise cascaded rectifier cells, such as the rectifier cells 920, 930, and 940.

Each of the CMOS transistors M1a, M1b, M2a, M2b, MNa, and MNb may comprise diode-connected MOSFETs to enable rectification of AC signals. The capacitors C1a, C1b, C2a, C2b, CNa, and CNb may be operable to receive charge from forward-biased CMOS transistors due to the applied RF signal. The DC voltage, VDC, may be equal to 2*N*(VRF−Vdrop), where N is the number of stages, VRF is the magnitude of the applied RF signal, and Vdrop is the voltage drop across the forward-biased diode-connected CMOS transistors M1a, M1b, M2a, M2b, MNa, and MNb. Therefore, transistors with lower threshold voltage, and thus lower Vdrop, such as native MOSFETS, may result in increased efficiency.

In operation, an RF signal, RF, may be applied to the RF-to-DC converter 900. In instances where the voltage of the applied signal, RF, is positive and the magnitude greater than the turn-on voltage for the CMOS transistors, the CMOS transistors M1b, M2b . . . MNb may be switched on and allow current to charge the capacitors. Similarly, when the voltage of the applied signal, RF, is negative with a magnitude greater than the turn-on voltage of the CMOS transistors, the CMOS transistors M1a, M2a . . . MNa may be switched on allowing the capacitors C1a, C2a, . . . , and CNa to be charged by current in the opposite direction. By cascading N rectifier cells, such as rectifier cell 1 920, rectifier cell 2, 930, . . . , and rectifier cell N 940, large DC voltages may be generated at the output labeled VDC with a magnitude equal to 2*N*(VRF−Vdrop).

In this manner, the wireless device 150 may be operable to generate DC voltages from received RF signals, thereby transferring power via RF signals transmitted and/or received by leaky wave antennas.

Figure 10:
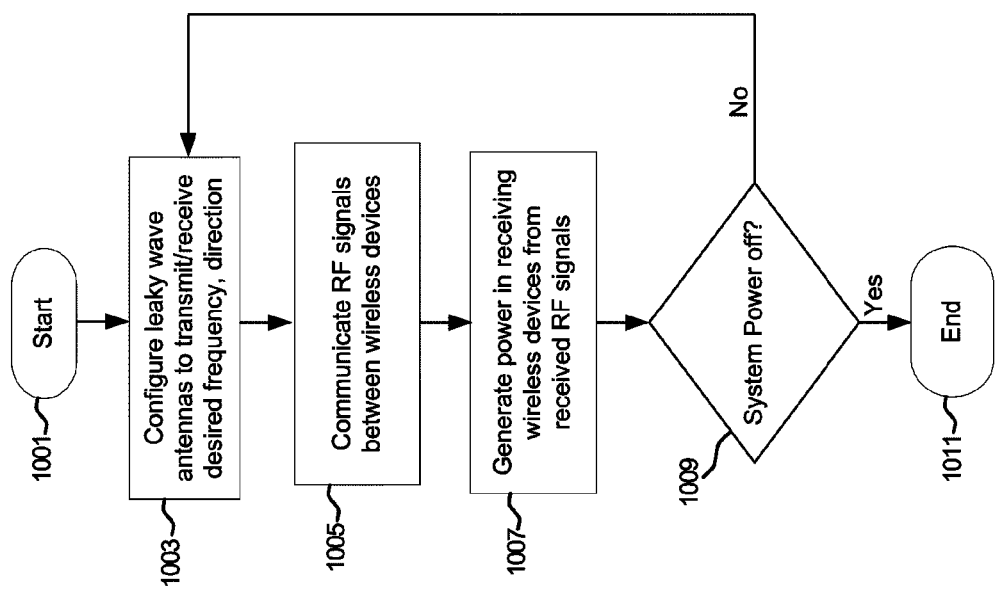
FIG. 10 is a block diagram illustrating exemplary steps for transferring power via leaky wave antennas, in accordance with an embodiment of the invention.

FIG. 10 is a block diagram illustrating exemplary steps for transferring power via leaky wave antennas, in accordance with an embodiment of the invention. Referring to FIG. 10, in step 1003 after start step 1001, one or more leaky wave antennas may be configured for a desired frequency via MEMS deflection or by selection of one or more leaky wave antennas with an appropriate cavity height in the package, for example. In addition, the Q of the cavity may be adjusted via shorting and/or opening slots or patches in the partially reflective surface, and/or configuring the direction of reception of the leaky wave antennas. In step 1005, high frequency RF signals may be communicated between wireless devices via leaky wave antennas. In step 1007, the received RF signals may be utilized to generate power for use in the wireless device 150. In step 1009, in instances where the wireless device 150 is to be powered down, the exemplary steps may proceed to end step 1011. In step 1009, in instances where the wireless device 150 is not to be powered down, the exemplary steps may proceed to step 1003 to configure the leaky wave antenna at a desired frequency/Q-factor/direction of transmission and/or reception.

In an embodiment of the invention, a method and system are disclosed for configuring one or more leaky wave antennas in a communication device to receive RF signals that are communicated from one or more other leaky wave antennas that are external to the communication device. The communication device may be powered utilizing the RF signals that are received via the configured one or more leaky wave antennas. A resonant frequency of the one or more leaky wave antennas 164A-164C, 400, 420, 600, 720, 730, 811A-811F may be configured utilizing micro-electro-mechanical systems (MEMS) deflection. The one or more leaky wave antennas 164A-164C, 400, 420, 600, 720, 730, 811A-811F may be configured to receive the RF signals from a desired direction. The one or more leaky wave antennas 164A-164C, 400, 420, 600, 720, 730, 811A-811F may comprise microstrip waveguides 720, wherein a cavity height of the one or more leaky wave antennas 164A-164C, 400, 420, 600, 720, 730, 811A-811F is dependent on spacing between conductive lines 723 and 725 in the microstrip waveguides 720.

The one or more leaky wave antennas 164A-164C, 400, 420, 600, 720, 730, 811A-811F may comprise coplanar waveguides 730, wherein a cavity height of the one or more leaky wave antennas 164A-164C, 400, 420, 600, 720, 730, 811A-811F is dependent on spacing between conductive lines 731 and 733 in the coplanar waveguides 730. The received RF signals, RF, may be rectified via cascaded rectifier cells 920, 930, 940 to generate the one or more DC voltages, VDC. The one or more leaky wave antennas 164A-164C, 400, 420, 600, 720, 730, 811A-811F may be integrated in one or more integrated circuits 162, integrated circuit packages 167, and/or printed circuit boards 171. The one or more integrated circuit packages 167 may be affixed, such as by flip-chip bonding, to one or more printed circuit boards 171 and the one or more integrated circuits 162 may be flip-chip-bonded to the one or more integrated circuit packages 167.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for power transfer utilizing leaky wave antennas.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
   in a communication device comprising one or more leaky wave antennas:
   configuring said one or more leaky wave antennas to receive an RF signal that is communicated from an RF source that is external to said communication device; and
   powering said communication device utilizing said RF signal that is received via said configured one or more leaky wave antennas,
   wherein at least one of said one or more leaky wave antennas includes a plurality of impedance feed points and a first surface and a second surface that form a cavity having a cavity height, and each of the impedance feed points is configured to have a different height from each other while the cavity height is the same for each of the impedance feed points.

2. The method according to claim 1, comprising configuring a resonant frequency of said one or more leaky wave antennas utilizing micro-electro-mechanical systems (MEMS) deflection.

3. The method according to claim 1, comprising configuring said one or more leaky wave antennas to communicate said RF signal in a desired direction.

4. The method according to claim 1, wherein said one or more leaky wave antennas comprise microstrip waveguides.

5. The method according to claim 4, wherein the cavity height of said one or more leaky wave antennas is dependent on spacing between conductive lines in said microstrip waveguides.

6. The method according to claim 1, wherein said one or more leaky wave antennas comprise coplanar waveguides.

7. The method according to claim 6, wherein the cavity height of said one or more leaky wave antennas is dependent on spacing between conductive lines in said coplanar waveguides.

8. The method according to claim 1, wherein said one or more leaky wave antennas are integrated in one or more integrated circuits flip-chip bonded to one or more integrated circuit packages.

9. The method according to claim 1, wherein said one or more leaky wave antennas are integrated in one or more integrated circuit packages affixed to one or more printed circuit boards.

10. The method according to claim 1, wherein said one or more leaky wave antennas are integrated in one or more printed circuit boards.

11. A system for enabling communication, the system comprising:
   one or more circuits in a communication device comprising one or more leaky wave antennas, said one or more circuits being operable to:
   configure said one or more leaky wave antennas to receive an RF signal that is communicated from an RF source that is external to said communication device;
   power said communication device utilizing said RF signal that is received via said configured one or more leaky wave antennas;
   wherein at least one of said one or more leaky wave antennas includes a plurality of impedance feed points and a first surface and a second surface that form a cavity having a cavity height, and each of the impedance feed points is configured to have a different height from each other while the cavity height is the same for each of the impedance feed points.

12. The system according to claim 11, wherein said one or more circuits are operable to configure a resonant frequency of said one or more leaky wave antennas utilizing micro-electro-mechanical systems (MEMS) deflection.

13. The system according to claim 11, wherein said one or more circuits are operable to configure said one or more leaky wave antennas to communicate said RF signal in a desired direction.

14. The system according to claim 11, wherein said one or more leaky wave antennas comprise microstrip waveguides.

15. The system according to claim 14, wherein the cavity height of said one or more leaky wave antennas is dependent on a spacing between conductive lines in said microstrip waveguides.

16. The system according to claim 11, wherein said one or more leaky wave antennas comprise coplanar waveguides.

17. The system according to claim 16, wherein the cavity height of said one or more leaky wave antennas is dependent on a spacing between conductive lines in said coplanar waveguides.

18. The system according to claim 11, wherein said one or more leaky wave antennas are integrated in one or more integrated circuits flip-chip bonded to one or more integrated circuit packages.

19. The system according to claim 11, wherein said one or more leaky wave antennas are integrated in one or more integrated circuit packages affixed to one or more printed circuit boards.

20. The system according to claim 11, wherein said one or more leaky wave antennas are integrated in one or more printed circuit boards.

* * * * *